(12) United States Patent
Szewerenko et al.

(10) Patent No.: US 7,468,553 B2
(45) Date of Patent: Dec. 23, 2008

(54) STACKABLE MICROPACKAGES AND STACKED MODULES

(75) Inventors: Leland Szewerenko, Austin, TX (US); Paul Goodwin, Austin, TX (US); James Douglas Wehrly, Jr., Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 77 days.

(21) Appl. No.: 11/682,643

(22) Filed: Mar. 6, 2007

(65) Prior Publication Data

US 2008/0093724 A1 Apr. 24, 2008

Related U.S. Application Data

(60) Provisional application No. 60/862,431, filed on Oct. 20, 2006.

(51) Int. Cl.
*H01L 23/02* (2006.01)
(52) U.S. Cl. .................. 257/686; 257/E23.18
(58) Field of Classification Search ............... 257/686, 257/685
See application file for complete search history.

(56) References Cited

U.S. PATENT DOCUMENTS

| | | | |
|---|---|---|---|
| 3,436,604 A | 4/1969 | Hyltin | |
| 3,654,394 A | 4/1972 | Gordon | |
| 3,704,455 A | 11/1972 | Scarbrough | |
| 3,746,934 A | 7/1973 | Stein | |
| 3,766,439 A | 10/1973 | Isaacson | |
| 3,772,776 A | 11/1973 | Weisenburger | |
| 3,983,547 A | 9/1976 | Almasi | |
| 4,288,841 A | 9/1981 | Gogal | |
| 4,398,235 A | 8/1983 | Lutz et al. | |
| 4,406,508 A | 9/1983 | Sadigh-Behzadi | |
| 4,437,235 A | 3/1984 | McIver | |
| 4,466,183 A | 8/1984 | Burns | |
| 4,513,368 A | 4/1985 | Houseman | |
| 4,567,543 A | 1/1986 | Miniet | |
| 4,587,596 A | 5/1986 | Bunnell | |
| 4,645,944 A | 2/1987 | Uya | |
| 4,656,605 A | 4/1987 | Clayton | |
| 4,682,207 A | 7/1987 | Akasaki et al. | |
| 4,696,525 A | 9/1987 | Coller et al. | |
| 4,709,300 A | 11/1987 | Landis | |
| 4,733,461 A | 3/1988 | Nakano | |
| 4,758,875 A | 7/1988 | Fujisawa et al. | |
| 4,763,188 A | 8/1988 | Johnson | |
| 4,821,007 A | 4/1989 | Fields et al. | |

(Continued)

OTHER PUBLICATIONS

PCT/US07/81931 International Search Report and Written Opinion, PCT, May 22, 2008.

*Primary Examiner*—Leonardo Andujar
*Assistant Examiner*—Krista Soderholm
(74) *Attorney, Agent, or Firm*—Fish & Richardson P.C.

(57) ABSTRACT

The present invention provides a system and method for devising stackable assemblies that may be then stacked to create a stacked circuit module. One or more integrated circuit (IC) die are disposed on one or more sides of a redistribution substrate that is preferably flexible circuitry. In some preferred embodiments, the die and redistribution substrate are bonded together and wire-bond connected. Two or more stackable assemblies are interconnected through frame members to create low profile high density stacked circuit modules.

20 Claims, 5 Drawing Sheets

U.S. PATENT DOCUMENTS

| | | |
|---|---|---|
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,884,237 A | 11/1989 | Mueller et al. |
| 4,891,789 A | 1/1990 | Quattrini et al. |
| 4,894,706 A | 1/1990 | Sato et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,050,039 A | 9/1991 | Edfors |
| 5,053,853 A | 10/1991 | Haj-Ali-Ahmadi et al. |
| 5,065,277 A | 11/1991 | Davidson |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow et al. |
| 5,140,405 A | 8/1992 | King et al. |
| 5,159,434 A | 10/1992 | Kohno et al. |
| 5,159,535 A | 10/1992 | Desai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,243,133 A | 9/1993 | Engle et al. |
| 5,247,423 A | 9/1993 | Lin et al. |
| 5,252,857 A | 10/1993 | Kane et al. |
| 5,253,010 A | 10/1993 | Oku et al. |
| 5,259,770 A | 11/1993 | Bates et al. |
| 5,261,068 A | 11/1993 | Gaskins et al. |
| 5,262,927 A | 11/1993 | Chia et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,289,346 A | 2/1994 | Carey et al. |
| 5,311,401 A | 5/1994 | Gates et al. |
| 5,313,096 A | 5/1994 | Eide |
| 5,313,097 A | 5/1994 | Haj-Ali-Ahmadi et al. |
| 5,343,075 A | 8/1994 | Nishino |
| 5,345,205 A | 9/1994 | Kornrumpf |
| 5,347,428 A | 9/1994 | Carson et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,390,844 A | 2/1995 | Distefano et al. |
| 5,394,010 A | 2/1995 | Tazawa et al. |
| 5,394,300 A | 2/1995 | Yoshimura |
| 5,394,303 A | 2/1995 | Yamaji |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,422,435 A | 6/1995 | Takiar et al. |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley et al. |
| 5,484,959 A | 1/1996 | Burns |
| 5,491,612 A | 2/1996 | Nicewarner et al. |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,548,091 A | 8/1996 | DiStefano et al. |
| 5,552,631 A | 9/1996 | McCormick |
| 5,561,591 A | 10/1996 | Burns |
| 5,566,051 A | 10/1996 | Burns |
| 5,572,065 A | 11/1996 | Burns |
| 5,579,207 A | 11/1996 | Hayden et al. |
| 5,588,205 A | 12/1996 | Roane |
| 5,592,364 A | 1/1997 | Roane |
| 5,594,275 A | 1/1997 | Kwon et al. |
| 5,600,541 A | 2/1997 | Bone et al. |
| 5,612,570 A | 3/1997 | Eide et al. |
| 5,625,221 A | 4/1997 | Kim et al. |
| 5,631,807 A | 5/1997 | Griffin |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,657,537 A | 8/1997 | Saia et al. |
| 5,659,952 A | 8/1997 | Kovac et al. |
| 5,677,566 A | 10/1997 | King et al. |
| 5,677,569 A | 10/1997 | Choi et al. |
| 5,714,802 A | 2/1998 | Cloud et al. |
| 5,715,144 A | 2/1998 | Ameen et al. |
| 5,729,894 A | 3/1998 | Rostoker et al. |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner et al. |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,805,424 A | 9/1998 | Purinton |
| 5,811,879 A | 9/1998 | Akram |
| 5,835,988 A | 11/1998 | Ishii |
| 5,844,168 A | 12/1998 | Schueller et al. |
| 5,861,666 A | 1/1999 | Bellaar |
| 5,869,353 A | 2/1999 | Levy et al. |
| 5,899,705 A | 5/1999 | Akram |
| 5,917,242 A | 6/1999 | Ball |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,977,640 A | 11/1999 | Bertin et al. |
| 5,995,370 A | 11/1999 | Nakamori |

| Patent | Date | Inventor |
|---|---|---|
| 6,002,167 A | 12/1999 | Hatano et al. |
| 6,002,589 A | 12/1999 | Perino et al. |
| 6,013,948 A | 1/2000 | Akram et al. |
| 6,014,316 A | 1/2000 | Eide |
| 6,021,048 A | 2/2000 | Smith |
| 6,025,642 A | 2/2000 | Burns |
| 6,028,352 A | 2/2000 | Eide |
| 6,028,358 A | 2/2000 | Suzuki |
| 6,028,365 A | 2/2000 | Akram et al. |
| 6,030,856 A | 2/2000 | DiStefano et al. |
| 6,034,878 A | 3/2000 | Osaka et al. |
| 6,040,624 A | 3/2000 | Chambers et al. |
| 6,072,233 A | 6/2000 | Corisis et al. |
| 6,080,264 A | 6/2000 | Ball |
| 6,084,293 A | 7/2000 | Ohuchi |
| 6,084,294 A | 7/2000 | Tomita |
| 6,084,778 A | 7/2000 | Malhi |
| 6,091,145 A | 7/2000 | Clayton |
| 6,097,087 A | 8/2000 | Farnworth et al. |
| 6,104,089 A | 8/2000 | Akram |
| 6,121,676 A | 9/2000 | Solberg |
| RE36,916 E | 10/2000 | Moshayedi |
| 6,133,640 A | 10/2000 | Leedy |
| 6,137,164 A | 10/2000 | Yew et al. |
| 6,157,541 A | 12/2000 | Hacke |
| 6,166,443 A | 12/2000 | Inaba et al. |
| 6,172,418 B1 | 1/2001 | Iwase |
| 6,172,874 B1 | 1/2001 | Bartilson |
| 6,180,881 B1 | 1/2001 | Isaak |
| 6,187,652 B1 | 2/2001 | Chou et al. |
| 6,205,654 B1 | 3/2001 | Burns |
| 6,208,571 B1 | 3/2001 | Ikeda et al. |
| 6,214,641 B1 | 4/2001 | Akram |
| 6,222,737 B1 | 4/2001 | Ross |
| 6,222,739 B1 | 4/2001 | Bhakta et al. |
| 6,225,688 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,239,496 B1 | 5/2001 | Asada |
| 6,262,476 B1 | 7/2001 | Vidal |
| 6,262,895 B1 | 7/2001 | Forthun |
| 6,265,660 B1 | 7/2001 | Tandy |
| 6,265,766 B1 | 7/2001 | Moden |
| 6,266,252 B1 | 7/2001 | Karabatsos |
| 6,268,649 B1 | 7/2001 | Corisis et al. |
| 6,281,577 B1 | 8/2001 | Oppermann et al. |
| 6,288,924 B1 | 9/2001 | Sugano et al. |
| 6,294,406 B1 | 9/2001 | Bertin et al. |
| 6,300,163 B1 | 10/2001 | Akram |
| 6,300,679 B1 | 10/2001 | Mukerji et al. |
| 6,303,981 B1 | 10/2001 | Moden |
| 6,303,997 B1 | 10/2001 | Lee |
| 6,310,392 B1 | 10/2001 | Burns |
| 6,313,522 B1 | 11/2001 | Akram et al. |
| 6,313,998 B1 | 11/2001 | Kledzik |
| 6,316,825 B1 | 11/2001 | Park et al. |
| 6,316,838 B1 | 11/2001 | Ozawa et al. |
| 6,323,060 B1 | 11/2001 | Isaak |
| 6,329,708 B1 | 12/2001 | Komiyama |
| 6,329,713 B1 | 12/2001 | Farquhar et al. |
| 6,336,262 B1 | 1/2002 | Dalal et al. |
| 6,339,254 B1 | 1/2002 | Venkateshwaran et al. |
| 6,351,029 B1 | 2/2002 | Isaak |
| 6,360,433 B1 | 3/2002 | Ross |
| 6,368,896 B2 | 4/2002 | Farnworth et al. |
| 6,376,769 B1 | 4/2002 | Chung |
| 6,376,904 B1 | 4/2002 | Haba et al. |
| 6,388,333 B1 | 5/2002 | Taniguchi et al. |
| 6,392,162 B1 | 5/2002 | Karabatsos |
| 6,392,953 B2 | 5/2002 | Yamada et al. |
| 6,404,043 B1 | 6/2002 | Isaak |
| 6,404,049 B1 | 6/2002 | Shibamoto et al. |
| 6,410,857 B1 | 6/2002 | Gonya |
| 6,414,384 B1 | 7/2002 | Lo et al. |
| 6,426,240 B2 | 7/2002 | Isaak |
| 6,426,549 B1 | 7/2002 | Isaak |
| 6,428,360 B2 | 8/2002 | Hassanzadeh |
| 6,433,418 B1 | 8/2002 | Fujisawa et al. |
| 6,437,990 B1 | 8/2002 | Degani et al. |
| 6,444,490 B2 | 9/2002 | Bertin et al. |
| 6,444,921 B1 | 9/2002 | Wang et al. |
| 6,446,158 B1 | 9/2002 | Karabatsos |
| 6,449,159 B1 | 9/2002 | Haba |
| 6,452,826 B1 | 9/2002 | Kim et al. |
| 6,462,408 B1 | 10/2002 | Wehrly, Jr. |
| 6,462,412 B2 | 10/2002 | Kamei et al. |
| 6,462,421 B1 | 10/2002 | Hsu et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,178 B2 | 12/2002 | Coyle et al. |
| 6,489,687 B1 | 12/2002 | Hashimoto |
| 6,492,718 B2 | 12/2002 | Ohmori |
| 6,504,104 B2 | 1/2003 | Hacke et al. |
| 6,509,639 B1 | 1/2003 | Lin |
| 6,514,793 B2 | 2/2003 | Isaak |
| 6,514,794 B2 | 2/2003 | Haba et al. |
| 6,521,530 B2 | 2/2003 | Peters et al. |
| 6,522,018 B1 | 2/2003 | Tay et al. |
| 6,522,022 B2 | 2/2003 | Murayama |
| 6,525,413 B1 | 2/2003 | Cloud et al. |
| 6,528,870 B2 | 3/2003 | Fukatsu et al. |
| 6,531,337 B1 | 3/2003 | Akram et al. |
| 6,531,338 B2 | 3/2003 | Akram et al. |
| 6,532,162 B2 | 3/2003 | Schoenborn |
| 6,552,910 B1 | 4/2003 | Moon et al. |
| 6,560,117 B2 | 5/2003 | Moon |
| 6,563,217 B2 | 5/2003 | Corisis et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,583,502 B2 | 6/2003 | Lee et al. |
| 6,590,282 B1 | 7/2003 | Wang et al. |
| 6,600,222 B1 | 7/2003 | Levardo |
| 6,603,198 B2 | 8/2003 | Akram et al. |
| 6,608,763 B1 | 8/2003 | Burns et al. |
| 6,614,664 B2 | 9/2003 | Lee |
| 6,620,651 B2 | 9/2003 | He et al. |
| 6,627,984 B2 | 9/2003 | Bruce et al. |
| 6,646,335 B2 | 11/2003 | Emoto |
| 6,646,936 B2 | 11/2003 | Hamamatsu |
| 6,650,588 B2 | 11/2003 | Yamagata |
| 6,657,134 B2 | 12/2003 | Spielberger et al. |
| 6,660,561 B2 | 12/2003 | Forthun |
| 6,661,092 B2 | 12/2003 | Shibata et al. |
| 6,673,651 B2 | 1/2004 | Ohuchi et al. |
| 6,674,644 B2 | 1/2004 | Schulz |
| 6,677,670 B2 | 1/2004 | Kondo |
| 6,683,377 B1 | 1/2004 | Shim et al. |
| 6,686,656 B1 | 2/2004 | Koh et al. |
| 6,690,584 B2 | 2/2004 | Uzuka et al. |
| 6,699,730 B2 | 3/2004 | Kim et al. |
| 6,707,684 B1 | 3/2004 | Andric et al. |
| 6,710,437 B2 | 3/2004 | Takahashi et al. |
| 6,720,652 B2 | 4/2004 | Akram et al. |
| 6,721,226 B2 | 4/2004 | Woo et al. |
| 6,726,346 B2 | 4/2004 | Shoji |
| 6,737,742 B2 | 5/2004 | Sweterlitsch |
| 6,737,891 B2 | 5/2004 | Karabatsos |
| 6,740,981 B2 | 5/2004 | Hosomi |
| 6,746,894 B2 | 6/2004 | Yin et al. |
| 6,756,661 B2 | 6/2004 | Tsuneda et al. |
| 6,759,737 B2 | 7/2004 | Seo et al. |

| | | | | | | |
|---|---|---|---|---|---|---|
| 6,760,220 | B2 | 7/2004 | Canter et al. | 7,011,981 B2 | 3/2006 | Kim et al. |
| 6,765,288 | B2 | 7/2004 | Damberg | 7,023,701 B2 | 4/2006 | Stocken et al. |
| 6,768,660 | B2 | 7/2004 | Kong et al. | 7,053,485 B2 | 5/2006 | Bang et al. |
| 6,774,475 | B2 | 8/2004 | Blackshear et al. | 7,053,486 B2 | 5/2006 | Shizuno |
| 6,777,794 | B2 | 8/2004 | Nakajima | 7,057,278 B2 | 6/2006 | Naka et al. |
| 6,781,240 | B2 | 8/2004 | Choi et al. | 7,061,088 B2 | 6/2006 | Karnezos |
| 6,788,560 | B2 | 9/2004 | Sugano et al. | 7,061,121 B2 | 6/2006 | Haba |
| 6,798,057 | B2 | 9/2004 | Bolkin et al. | 7,061,122 B2 | 6/2006 | Kim et al. |
| 6,812,567 | B2 | 11/2004 | Kim et al. | 7,064,426 B2 | 6/2006 | Karnezos |
| 6,815,818 | B2 | 11/2004 | Moore et al. | 7,071,547 B2 | 7/2006 | Kang et al. |
| 6,826,066 | B2 | 11/2004 | Kozaru | 7,078,793 B2 | 7/2006 | Ruckerbauer et al. |
| 6,833,984 | B1 | 12/2004 | Belgacem | 7,102,221 B2 | 9/2006 | Miyamoto et al. |
| 6,838,761 | B2 | 1/2005 | Karnezos | 7,109,576 B2 | 9/2006 | Bolken et al. |
| 6,839,266 | B1 | 1/2005 | Garrett et al. | 7,115,982 B2 | 10/2006 | Moxham |
| 6,841,868 | B2 | 1/2005 | Akram et al. | 7,115,986 B2 | 10/2006 | Moon et al. |
| 6,849,949 | B1 | 2/2005 | Lyu et al. | 7,129,571 B2 | 10/2006 | Kang |
| 6,850,414 | B2 | 2/2005 | Benisek et al. | 7,149,095 B2 | 12/2006 | Warner et al. |
| 6,853,064 | B2 | 2/2005 | Bolken et al. | 7,161,237 B2 | 1/2007 | Lee |
| 6,858,910 | B2 | 2/2005 | Coyle et al. | 2001/0013423 A1 | 8/2001 | Dalal et al. |
| 6,869,825 | B2 | 3/2005 | Chiu | 2001/0040793 A1 | 11/2001 | Inaba |
| 6,873,039 | B2 | 3/2005 | Beroz et al. | 2002/0006032 A1 | 1/2002 | Karabatsos |
| 6,876,074 | B2 | 4/2005 | Kim | 2002/0094603 A1 | 7/2002 | Isaak |
| 6,878,571 | B2 | 4/2005 | Isaak et al. | 2002/0196612 A1 | 12/2002 | Gall et al. |
| 6,884,653 | B2 | 4/2005 | Larson | 2003/0064548 A1 | 4/2003 | Isaak |
| 6,893,897 | B2 | 5/2005 | Sweterlitsch | 2003/0090879 A1 | 5/2003 | Doblar et al. |
| 6,897,565 | B2 | 5/2005 | Pflughaupt et al. | 2003/0116835 A1 | 6/2003 | Miyamoto et al. |
| 6,906,416 | B2 | 6/2005 | Karnezos | 2003/0159278 A1 | 8/2003 | Peddle |
| 6,908,792 | B2 | 6/2005 | Bruce et al. | 2004/0075991 A1 | 4/2004 | Haba et al. |
| 6,910,268 | B2 | 6/2005 | Miller | 2004/0115866 A1 | 6/2004 | Bang et al. |
| 6,913,949 | B2 | 7/2005 | Pflughaupt et al. | 2004/0150107 A1 | 8/2004 | Cha et al. |
| 6,914,324 | B2 | 7/2005 | Rapport et al. | 2004/0201087 A1 | 10/2004 | Lee |
| 6,919,626 | B2 | 7/2005 | Burns | 2004/0217461 A1 | 11/2004 | Damberg |
| 6,927,471 | B2 | 8/2005 | Salmon | 2004/0217471 A1 | 11/2004 | Haba |
| 6,940,158 | B2 | 9/2005 | Haba et al. | 2004/0245617 A1 | 12/2004 | Damberg et al. |
| 6,940,729 | B2 | 9/2005 | Cady et al. | 2004/0267409 A1 | 12/2004 | De Lorenzo et al. |
| 6,943,454 | B1 | 9/2005 | Gulachenski et al. | 2005/0018495 A1 | 1/2005 | Bhakta et al. |
| 6,956,883 | B2 | 10/2005 | Kamoto | 2005/0035440 A1 | 2/2005 | Mohammed |
| 6,972,481 | B2 | 12/2005 | Karnezos | 2005/0040508 A1 | 2/2005 | Lee |
| 6,977,440 | B2 | 12/2005 | Pflughaupt et al. | 2005/0108468 A1 | 5/2005 | Hazelzet et al. |
| 6,978,538 | B2 | 12/2005 | DiStefano et al. | 2005/0133897 A1 | 6/2005 | Baek et al. |
| 6,989,285 | B2 | 1/2006 | Ball | | | |

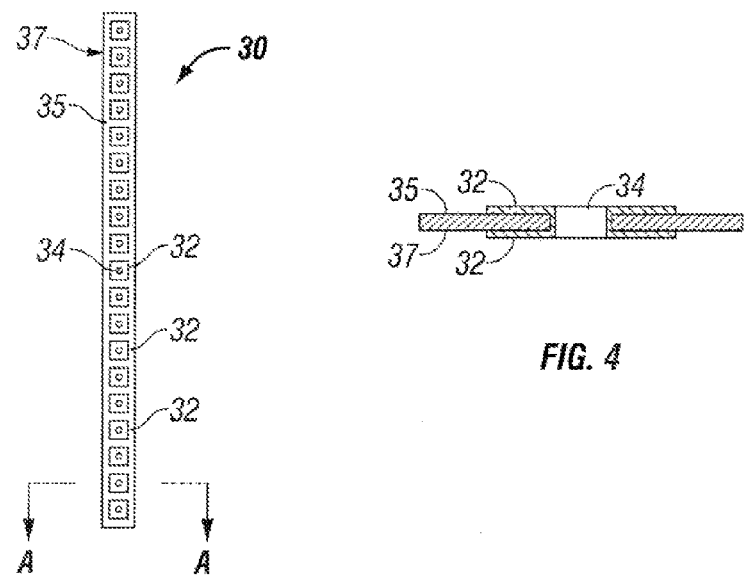
FIG. 3
FIG. 4
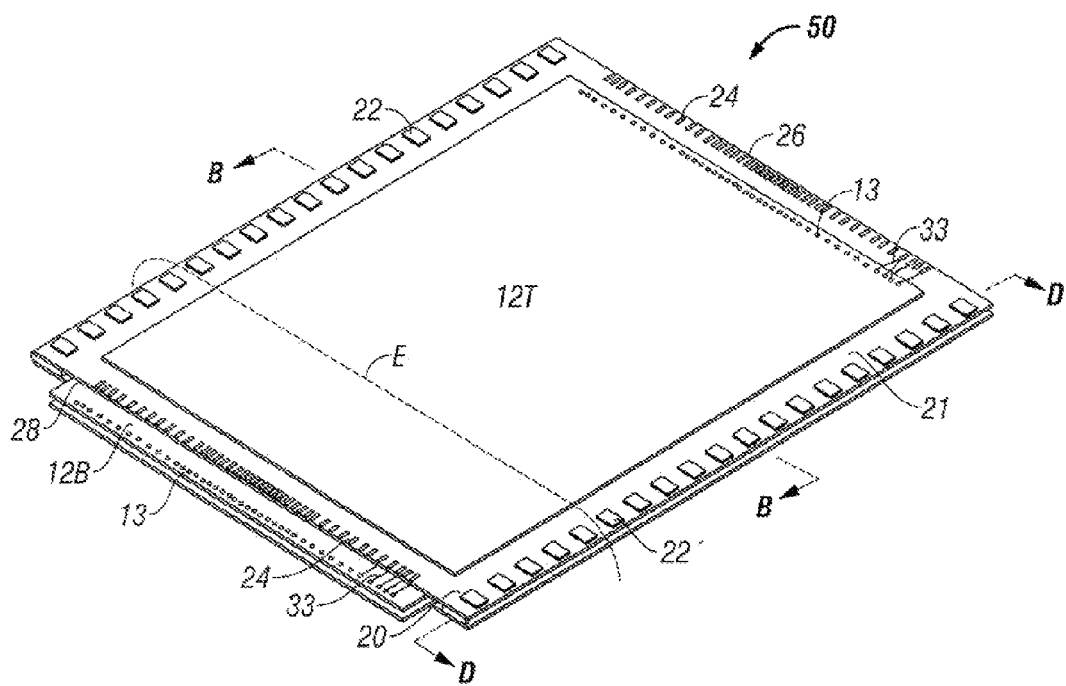
FIG. 5

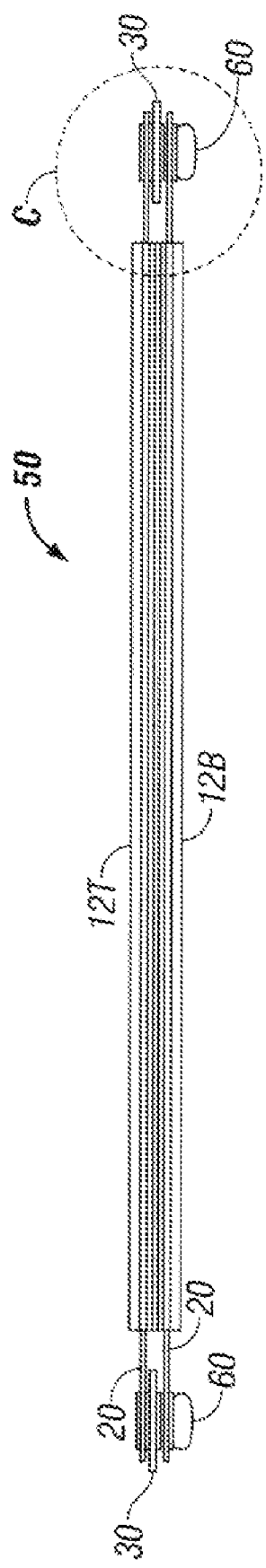
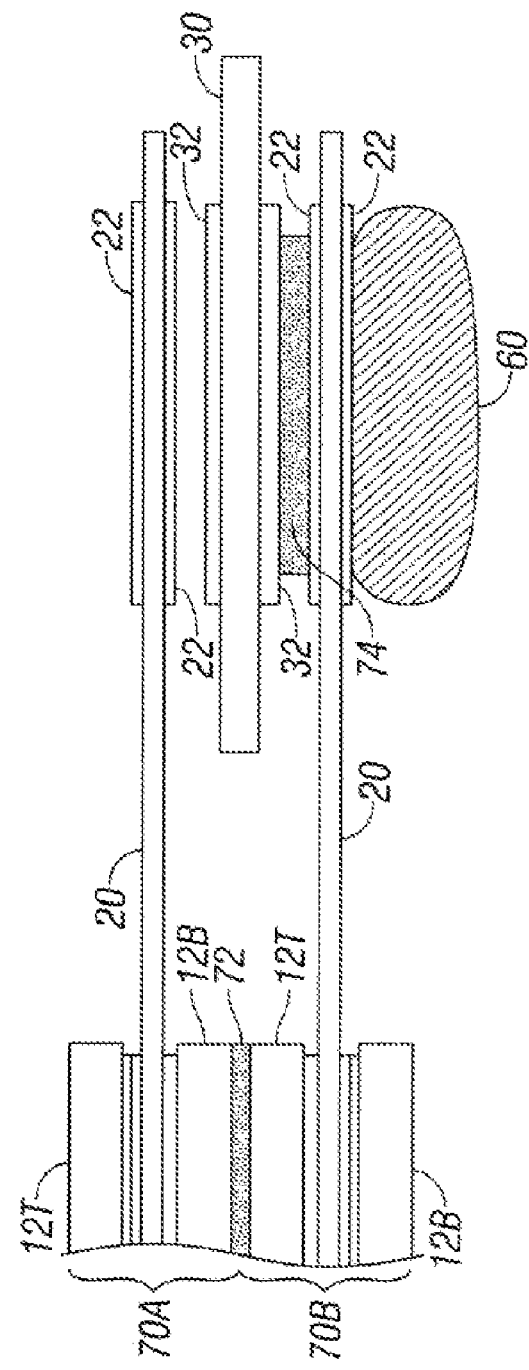
FIG. 6
FIG. 7

STACKABLE MICROPACKAGES AND STACKED MODULES

CROSS REFERENCE TO RELATED APPLICATIONS

This application claims priority to provisional application No. 60/862,431 filed Oct. 20, 2006, pending, which is hereby incorporated by reference.

TECHNICAL FIELD

The present invention relates to aggregating integrated circuits and, in particular, to stacks and stacking integrated circuits.

BACKGROUND

A variety of techniques are used to stack integrated circuits into a module. Some require that the circuits be encapsulated in special packages, while others use circuits in conventional packages. Both leaded and BGA type packaged integrated circuits (ICs) have been stacked. Although BGA packaging has become widely adopted, leaded packages are still employed in large volumes in low cost applications such as, for example, flash memory, which, when packaged, is typically found in thin small outline packages otherwise known as TSOPs.

Other technologies have been devised to stack bare die or flip-chip configured integrated circuits. In a typical example, flex circuitry upon which such integrated circuits have been affixed has been employed to supplant the role of encapsulating packaging. In some strategies, flex circuitry bearing bare or flip-chip die is folded over itself to yield a multi-level module in which the constituent die are disposed vertically one above the other with module contacts being provided along one or more surfaces of the flex circuitry. In other strategies, such as purportedly disclosed in U.S. Pat. No. 6,388,333 to Taniguchi, et al., a substrate bears an integrated circuit die that is encapsulated by a seal material having a height less than protruding electrodes connected to pads on the redistribution substrate which are connected to the die. Other previous systems have purportedly disposed flip-chip devices active face down on substrates that are connected one to another through conductive members as describer in U.S. Pat. No. 6,781,241 to Nishimura et al.

Most previous systems that employ unpackaged die have provided complex structures with attendant scalability and construction technique complexities. Consequently, what is needed is a system and method for stacks and stacking die that is readily adaptable to scalability, while using well understood materials with facility for known good die management.

SUMMARY

The present invention provides a system and method for stacked circuit modules and stackable assemblies that may be stacked to create a stacked circuit module. One or more integrated circuit (IC) die are disposed on one or more sides of a redistribution substrate that is preferably flexible circuitry. In some preferred embodiments, the die and redistribution substrate are bonded together and wire-bond connected. Two or more stackable assemblies are interconnected through frame members to create low profile, high density stacked circuit modules.

BRIEF DESCRIPTION OF THE DRAWINGS

FIG. 3 depicts a frame member that may be employed in embodiments of the present stacked module.

FIG. 4 is an enlarged depiction of a pad and via construction in an exemplar frame member as seen along line A-A in FIG. 3.

FIG. 5 is a perspective depiction of an exemplar stacked module in accordance with an embodiment.

FIG. 6 is a cross-sectional depiction of an exemplar stacked IC module devised in accord with an embodiment as seen along line B-B of FIG. 5.

FIG. 7 is an enlarged depiction of a portion of the cross-sectional view of a stacked module identified in FIG. 6 by "C".

DETAILED DESCRIPTION

Figure 1:
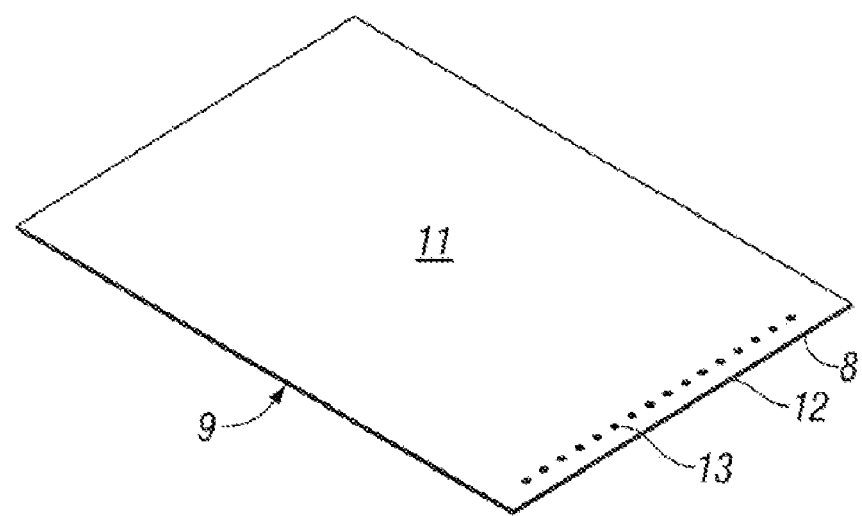
FIG. 1 depicts an exemplar IC die as may be employed in embodiments.

FIG. 1 depicts an exemplar IC die 12 as may be employed in embodiments of a stacked module. IC die 12 has a first side 11 and second side (indicated by reference 9) and edge 8 proximal to which are found plural die pads 13. Although the present invention may be employed to advantage with die of a variety of functions and sizes, it is particularly advantageous for use with memory IC die including but not limited to flash memory. Through the present invention, IC die may be aggregated in a vertical stacked module that provides high density and helps ameliorate the steep next-generation cost slope typically encountered when higher memory density demands are satisfied with higher cost next generation monolithic devices. Depicted die 12 shown in FIG. 1 should be considered a proxy for any of variety of die that can be stacked to advantage and, in particular, memory IC die. As shown, die 12 exhibits die pads 13 which, as those of skill will recognize, can be located in a variety of locations, but are often found along one or more edges of the die such as the identified edge 8.

Figure 2:
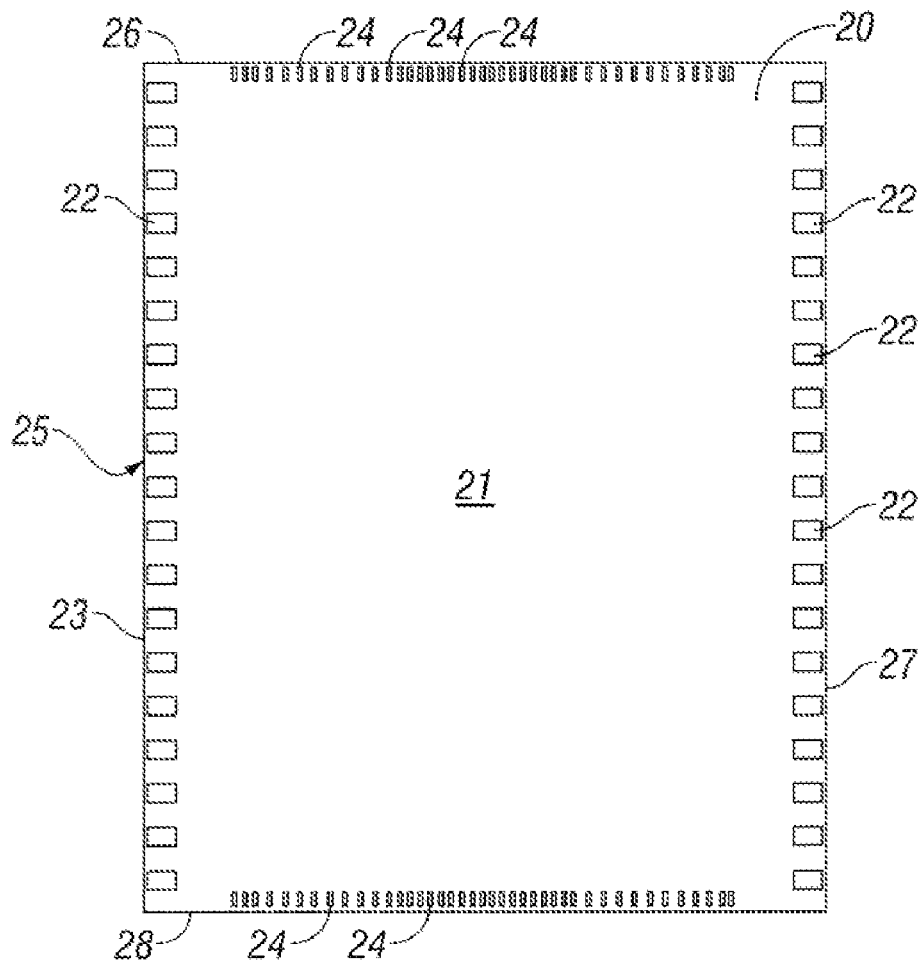
FIG. 2 depicts an exemplar redistribution substrate as may be employed in embodiments.

FIG. 2 depicts an exemplar redistribution substrate 20 as may be employed in embodiments. Although it can be devised from a variety of conductive substrates capable of bearing a network of conductive traces and connectors, substrate 20 is preferably a flexible circuit devised with a thin profile and has upper surface 21 and indicated lower surface 25 which those of skill will understand is present but not visible in the view of FIG. 2. Many techniques can be employed to reduce the thickness of substrate 20 including, for example, devising the substrate without a covercoat. As shown in FIG. 2, substrate 20 exhibits connective sites 22 along edges 23 and 27 of substrate 20 which sites are, in a preferred embodiment, typically pads which are well known in the art in a variety of configurations. Typically, connective sites 22 are on each of sides 21 and 25 of substrate 20.

The disclosed stackable assemblies can be interconnected through the respective connection sites 22 to form a stacked circuit module. Wire bond pads 24 are shown adjacent to edges 26 and 28 of surface 21 of substrate 20. When a lower die 12B (as shown in later Figs.) is attached to lower surface 25 of substrate 20, it is preferably disposed so that it is emergent beyond one of the perimeter edges of substrate 20 to expose its own die pads 13 for wire bond connection to substrate 20. This allows the wire bonding operation to be done without repositioning of the substrate assembly. Typically, this will require rotation of lower die 12B 180 degrees relative to the orientation of upper die 12T. Die 12 and substrate 20 are, typically but not always, close to the same size so that the advantages provided by the use of stackable assemblies disclosed herein are not outweighed by the minor increase in size.

FIG. 3 depicts a frame member 30 that may be employed in some embodiments of the present stacked module. As shown, frame member 30 exhibits frame pads 32 having vias 34 that provide connection between upper and lower frame pads along upper and lower sides 35 and 37 respectively of frame member 30. Preferably, the distance between upper and lower sides 35 and 37 of frame member 30 is less than twice the thickness of IC die 12. Frame member 30 provides structure or stiffness for stacked module embodiments and is disposed at least in part between substrates 20 in a stacked module embodiment as will be shown in more detail. As those of skill will appreciate, frame member 30 is preferably disposed along the row of connective sites 22 adjacent to selected sides of substrate 20 and thus provides connection and structure between stackable assemblies. Frame member 30 can be devised from a variety of materials such as, for example, circuit board material such as FR4 or other epoxy or fiber structural material appropriate for support of a network of conductive pad structures and vias. Frame member 30 can be devised in accordance with low profile objectives and those of skill will appreciate that die thickness is one of the determinants of minimum thickness for frame member 30.

FIG. 4 is an enlarged depiction of a pad and via construction in an exemplar frame member 30 as seen along line A-A in FIG. 3. As shown, frame pads 32 can be formed on each of sides 35 and 37 of frame member 30 with a hole that is preferably plated to create via 34 that passes between the frame pad 32 on side 35 to the corresponding frame pad 32 on side 37.

FIG. 5 is a perspective depiction of an exemplar stacked module 50 in accordance with an embodiment. As shown in FIG. 5, die 12T is disposed on upper surface 21 of substrate 20 and wire-bonded to wire bond pads 24 along side 26 of substrate 20 through exemplar wire bonds 33. Shown emergent from beneath substrate 20, lower die 12B is also wire-bonded to wire bond pads 24 along upper surface 21 near edge 28 of substrate 20 as shown by the exemplar wire bonds 33.

The depiction of FIG. 5 includes four (4) die 12 and two substrates 20 in a high density stacked circuit module 50 in accordance with an embodiment. Stacked module 50 is preferably encapsulated with any of the variety of encapsulants known in the industry. The encapsulant is represented by arcing dotted line E across module 50.

FIG. 6 a cross-sectional depiction of an exemplar stacked IC module 50 devised in accord with an embodiment as seen along line B-B of FIG. 5. In the view of FIG. 6, two stacked packages are stacked together to create stacked module 50. Also shown in FIG. 6, application contact 60 provides the capability to connect stacked module 50 to an application environment. As those of skill will recognize, application contacts 60 can be configured in a variety of different dimensions and shapes to correspond to the constraints of the particular application where stacked module 50 is employed. The depicted example of a ball contact serving as application contact 60 should be understood to merely be an example and not limiting of the many different configurations available for application contact 60 such as, for example, pads. For example, it is also possible to use an additional frame member 30 in place of contacts 60 to connect a stacked module to a transposer substrate or system board.

FIG. 7 is an enlarged depiction of a portion of the cross-sectional view of stacked module 50 identified in FIG. 6 by "C". As shown in FIG. 7, frame member 30 is disposed (at least in part) between corresponding inner connective sites 22 of two different stackable assemblies 70 that are bonded together. If adhesives are used, a thermally conductive adhesive is preferred. In the depiction of FIG. 7, space is shown between frame pad 32 and the corresponding inner connective site 22 of the upper one of the constituent stacked assemblies 70 of the depicted exemplar stacked module 50. The depicted space is provided for clarity of the exposition and those of skill will understand that frame pads 32 and connective sites 22 are connected. Between lower frame pad 32 and the inner connective site 22 of stackable assembly 70B (lower in FIG. 7) solder 74 is shown as an exemplar connective material between frame pads 32 and connective sites 22 of the exemplar stacked module 50.

Figure 8:
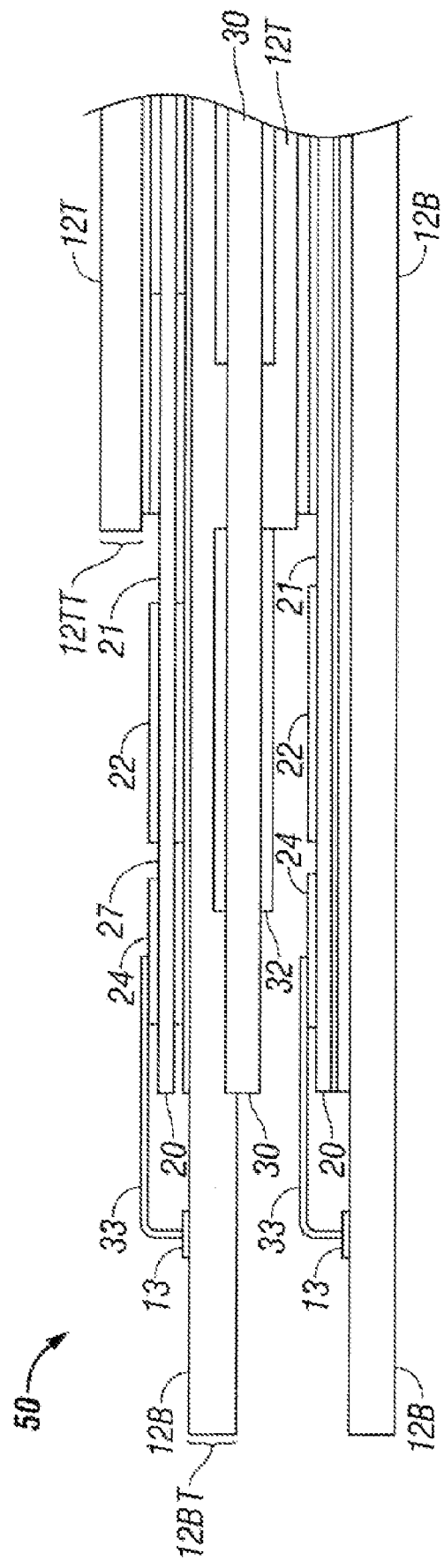
FIG. 8 depicts an enlarged cross-sectional view of an exemplar stacked IC module devised in accord with an embodiment as seen along line D-D of FIG. 5.

FIG. 8 depicts and enlarged cross-sectional view of an exemplar stacked IC module 50 devised in accord with an embodiment as seen along line D-D of FIG. 5. For clarity of the exposition, the application contacts are not shown but the wire bonds 33 between IC die 21B and substrates 20 of stackable assemblies are shown. As shown in FIG. 8, upper die 12T is disposed on substrate 20 while lower die 12B is seen emergent from beneath substrate 20 exposing die pads 13 that are to be wire-bonded to wire bond pads 24 of substrate 20. Thus, both die 12T and 12B connected to the same side of substrate 20 even though the two die are attached to different sides of that substrate. The wire bond pads 24 of upper die 12T are not visible in the depiction of FIG. 8. Frame member 30 is shown along lateral edge 27 of substrates 20 and, in practice, those of skill will recognize that typically, two frame members 30 are typically employed when, for example, two stackable assemblies 70 are stacked to create a stacked module 50 and those frame members will typically be disposed along edges 27 and 23 of first and second redistribution substrates 20. Although the example shown illustrates die with bond-pads along one edge, it can be seen that the same techniques illustrated would work with pads along two adjacent edges. In such instances, the lower and upper die are displaced along both axes to expose the bond out pads of the lower die for wire bonding to two edges of the substrate. In such instances, the substrate would be extended along one or both axes to allow for contacts and positioning of the frame members.

Figure 9:
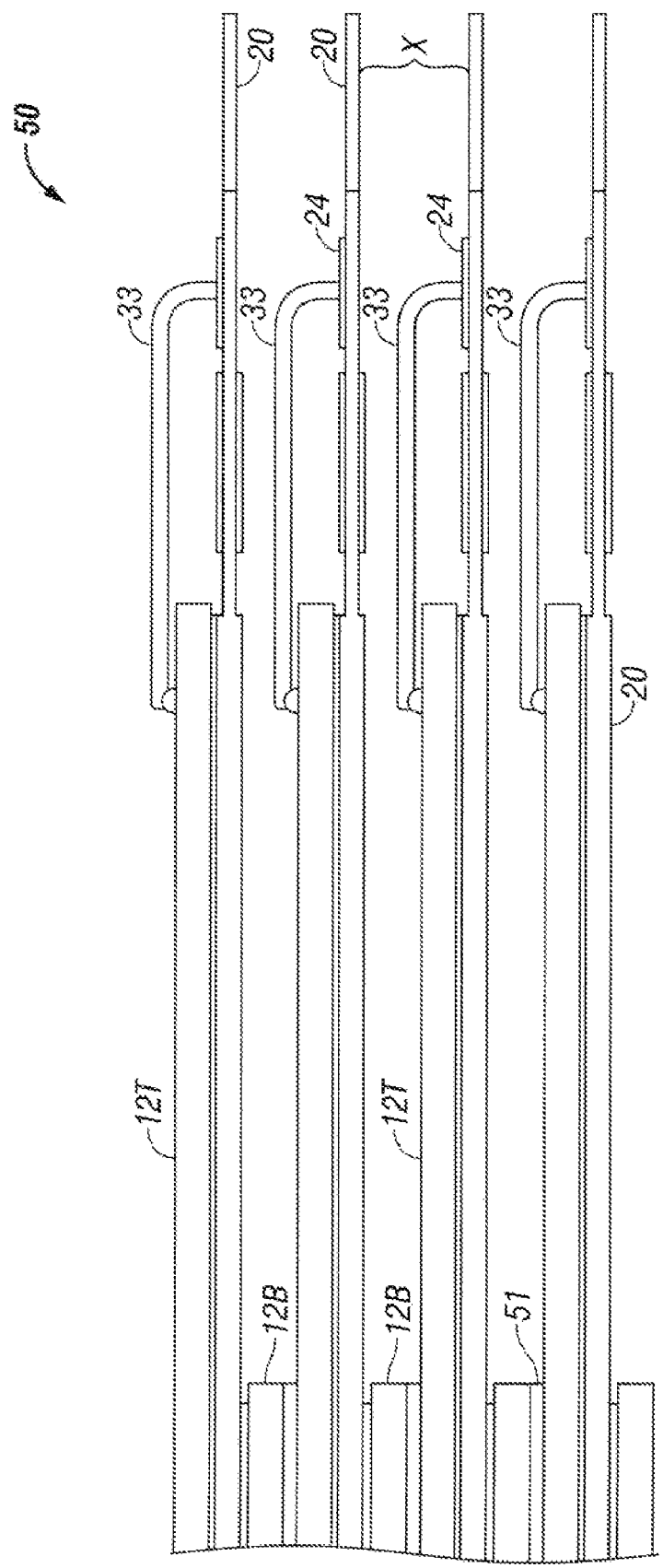
FIG. 9 depicts an enlarged cross-sectional view of an exemplar stacked IC module devised in accord with a embodiment.

FIG. 9 illustrates the wire bond connection between upper die 12T and substrate 20 in a stacked module 50 comprised from four (4) stackable assemblies. The embodiment depicted in FIG. 9 illustrates how wire bonds 33 nest into the space between substrates as indicated by dimension "X" that is, at a minimum, the thickness of a selected upper die 12T and an adjacent selected lower die 12B. For purposes of clarity of view, the thickness of upper die 12T has been indicated in FIG. 8 rather than FIG. 9 and is indicated with reference 12TT while the thickness of lower die 12B is indicated with reference 12BT.

Typically an adhesive or other bond 51 is used between adjacent upper and lower die 12T and 12B, respectively. Consequently, where adhesive or bonding layer 51 is present, "X" will also include the thickness of layer 51 between the respective die. Thus, because the wire bond does not extend above the surface of the redistribution substrate a distance greater than "X", the wire bond does not contribute to the overall height of stacked module 50 except as to the top-most one of the multiple assemblies.

Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A stacked circuit module comprised:
 a first IC die having first and second surfaces with die pads disposed along the first surface;
 a second IC die having first and second surfaces with die pads disposed along the first surface and proximal to a die edge;
 a first redistribution substrate having a first side and a second side and first, second, third and fourth perimeter edges and plural connective sites and wire bond pads, the plural connective sites being disposed along each of the first and second sides and located proximal to at least the first and third perimeter edges of the first redistribution substrate while the wire bond pads are disposed on the first side of the first redistribution substrate proximal to the second and fourth perimeter edges,
  the first IC die being attached on its second surface to the first side of the first redistribution substrate and the die pads of the first IC die being wire-bonded to the wire bond pads of the first redistribution substrate proximal to the second perimeter edge and the second IC die being attached on its first surface to the second side of the first redistribution substrate and disposed to extend beyond the fourth perimeter edge of the first redistribution substrate and the die pads of the second IC die are wire-bonded to the wire bond pads of the first redistribution substrate proximal to the fourth perimeter edge;
 a third IC die having first and second surfaces with die pads disposed along the first surface;
 a fourth IC die having first and second surfaces with die pads disposed along the first surface and proximal to a die edge of the fourth IC die;
 a second redistribution substrate having a first side and a second side and first, second, third and fourth perimeter edges and plural connective sites and wire bond pads, the plural connective sites being disposed along each of the first and second sides and located proximal to at least the first and third perimeter edges of the second redistribution substrate while the wire bond pads are disposed on the first side of the second redistribution substrate proximal to the second and fourth perimeter edges,
  the third IC die being attached on its second surface to the first side of the second redistribution substrate and the die pads of the third IC die being wire-bonded to the wire bond pads of the second redistribution substrate proximal to the second perimeter edge and the fourth IC die being attached on its first surface to the second side of the second redistribution substrate and disposed to extend beyond the fourth perimeter edge of the second redistribution substrate and the die pads of the fourth IC die are wire-bonded to the wire bond pads of the second redistribution substrate proximal to the fourth perimeter edge; and
 first and second frame members each having first and second frame member sides with plural frame pads on each of the first and second frame member sides, the first and second frame members being disposed at least in part between the first and second redistribution substrates to provide connection between the first and second redistribution substrates.

2. The circuit module of claim 1 further comprising application contacts.

3. The circuit module of claim 1 in which the third IC die is wired bonded to the second redistribution substrate with wire bonds and at least some of which wire bonds lie at least in part between the first and second redistribution substrates and rise no further above the first side of the second redistribution substrate than the sum of the thickness of the second IC die and the third IC die.

4. The circuit module of claim 1 in which the first and second redistribution substrates are comprised of flexible circuitry.

5. The circuit module of claim 1 in which the frame members are comprised of circuit board material.

6. The circuit module of claim 1 in which the frame members are disposed proximal to the first and third perimeter edges of the first and second redistribution substrates to provide connection between the plural connective sites of the first and second redistribution substrates.

7. The circuit module of claim 6 in which the frame members are thinner than the second IC die or the third IC die.

8. The circuit module of claim 6 further comprising an encapsulant disposed about at least the first IC die.

9. A stackable assembly comprising:
 a first IC memory circuit die having die pads along a first die surface of the first IC memory die;
 a second IC memory circuit die having die pads along a first die surface of the second IC memory die;
 a first redistribution substrate comprised of flexible circuitry, the first redistribution substrate having a first side and a second side and first, second, third and fourth perimeter edges and plural connective sites and wire bond pads, the plural connective sites being disposed along each of the first and second sides and located proximal to at least the first and third perimeter edges of the first redistribution substrate while the wire bond pads are disposed on the first side of the first redistribution substrate proximal to the second and fourth perimeter edges,
  the first IC memory circuit die being attached on its second surface to the first side of the first redistribution substrate and the die pads of the first IC memory circuit die being wire-bonded to the wire bond pads of the first redistribution substrate proximal to the second perimeter edge and the second IC memory circuit die being attached on its first surface to the second side of the first redistribution substrate and disposed to extend beyond the fourth perimeter edge of the first redistribution substrate and the die pads of the second IC memory circuit die are wire-bonded to the wire bond pads of the first redistribution substrate proximal to the fourth perimeter edge.

10. A stacked circuit module comprised from two iterations of the stackable assembly of claim 9.

11. A stacked circuit module comprised from three iterations of the stackable assembly of claim 9.

12. A stackable assembly comprising:
 a first IC die having first and second faces and die pads on the first face of the first IC die which are disposed along an edge of the first IC die;
 a second IC die having first and second faces and die pads on the first face of the second IC die which are disposed along an edge of the second IC die;

a redistribution substrate comprised of flexible circuitry, the redistribution substrate having four perimeter sides, and a first side and a second side with the first side having wire bond pads, the first IC die being attached on its second face to the first side of the redistribution substrate and the second IC die being attached on its first face to the second side of the redistribution substrate with the second IC die rotated 180 degrees relative to the disposition of the first IC die and the second IC die extending beyond at least one of the four perimeter edges of the redistribution substrate to expose the die pads of the second IC die, the first and second IC die each being wire-bond connected to the wire bond pads of the first side of redistribution substrate.

13. A stacked circuit module comprised from two iterations of the stackable assembly of claim 12 and further comprising frame members disposed at least in part between the redistribution substrates of the two respective stackable assemblies to provide connection between said redistribution substrates.

14. The stacked circuit module of claim 13 in which the frame members are disposed proximal to at least two of the four perimeter sides of the redistribution substrates.

15. The stacked circuit module of claim 14 in which the frame members are comprised of circuit board material.

16. The stacked circuit module of claim 14 in which the frame members are comprised of frame pads connected through a via.

17. The stacked circuit module of claim 14 in which the frame members are comprised of epoxy or resin.

18. The stacked circuit module of claim 14 in which the first and second IC die are each flash memory circuits.

19. The stackable assembly of claim 12 in which the first and second IC die are flash memory circuits.

20. A stacked module comprising multiple iterations of the stackable assembly of claim 12.

* * * * *

UNITED STATES PATENT AND TRADEMARK OFFICE
CERTIFICATE OF CORRECTION

PATENT NO. : 7,468,553 B2
APPLICATION NO. : 11/682643
DATED : December 23, 2008
INVENTOR(S) : Leland Szewerenko It is certified that error appears in the above-identified patent and that said Letters Patent is hereby corrected as shown below:

In claim 1, column 5, line 12, after "comprised" delete ":" and insert --of:--, therefor.

Signed and Sealed this

Third Day of March, 2009

JOHN DOLL
*Acting Director of the United States Patent and Trademark Office*